(12) United States Patent
Van Schoot et al.

(10) Patent No.: US 9,632,419 B2
(45) Date of Patent: Apr. 25, 2017

(54) RADIATION SOURCE

(75) Inventors: Jan Bernard Plechelmus Van Schoot, Eindhoven (NL); Vadim Yevgenyevich Banine, Deurne (NL); Olav Waldemar Vladimir Frijns, Rosmalen (NL); Hermanus Kreuwel, Schijndel (NL); Johannes Hubertus Josephina Moors, Helmond (NL); Uwe Bruno Heini Stamm, Goettingen (DE); Gerardus Hubertus Petrus Maria Swinkels, Eindhoven (NL); Ivo Vanderhallen, Eindhoven (NL); Andrei Mikhailovich Yakunin, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 99 days.

(21) Appl. No.: 14/346,530

(22) PCT Filed: Aug. 23, 2012

(86) PCT No.: PCT/EP2012/066449
§ 371 (c)(1),
(2), (4) Date: May 20, 2014

(87) PCT Pub. No.: WO2013/041323
PCT Pub. Date: Mar. 28, 2013

(65) Prior Publication Data
US 2014/0253894 A1    Sep. 11, 2014

Related U.S. Application Data

(60) Provisional application No. 61/538,006, filed on Sep. 22, 2011, provisional application No. 61/606,715, (Continued)

(51) Int. Cl.
*G03B 27/32* (2006.01)
*G03B 27/52* (2006.01)
(Continued)

(52) U.S. Cl.
CPC ...... *G03F 7/70058* (2013.01); *G03F 7/70033* (2013.01); *H05G 2/005* (2013.01); *H05G 2/008* (2013.01)

(58) Field of Classification Search
CPC ............ G03F 7/70008; G03F 7/70033; G03F 7/70058; G03F 7/7055; G03F 7/70916; H05G 2/00–2/008
(Continued)

(56) References Cited

U.S. PATENT DOCUMENTS

2004/0264512 A1* 12/2004 Hartlove ................ H05G 2/008
372/5
2007/0001131 A1    1/2007 Ershov et al.
(Continued)

FOREIGN PATENT DOCUMENTS

EP    2 159 638 A1    3/2010
JP    2008-270149 A   11/2008
(Continued)

OTHER PUBLICATIONS

International Search Report directed to related International Patent Application No. PCT/EP2012/066449, mailed Dec. 4, 2012; 5 pages.
(Continued)

*Primary Examiner* — Colin Kreutzer
(74) *Attorney, Agent, or Firm* — Sterne, Kessler, Goldstein & Fox P.L.L.C.

(57) ABSTRACT

A radiation source having a fuel stream generator (110) that generates and directs a fuel stream (102) along a trajectory towards a plasma formation location (104). A pre-pulse laser radiation assembly directs a first beam of laser radiation (100) at the fuel stream at the plasma formation location to generate a modified fuel target (106). A main pulse laser radiation assembly directs a second beam of laser radiation
(Continued)

(108) at the modified fuel target at the plasma formation location to generate a radiation generating plasma (117). A collector (122) collects the radiation and directs it along an optical axis (105) of the radiation source. The first beam of laser radiation being directed toward the fuel stream substantially along the optical axis.

23 Claims, 7 Drawing Sheets

Related U.S. Application Data filed on Mar. 5, 2012, provisional application No. 61/635,758, filed on Apr. 19, 2012, provisional application No. 61/668,474, filed on Jul. 6, 2012.

(51) Int. Cl.
*G03B 27/54* (2006.01)
*G03F 7/20* (2006.01)
*H05G 2/00* (2006.01)

(58) Field of Classification Search
USPC ........... 250/492.1–493.1, 504 R; 355/30, 53, 355/67–70, 77
See application file for complete search history.

(56) References Cited

U.S. PATENT DOCUMENTS

| | | | |
|---|---|---|---|
| 2008/0149862 A1* | 6/2008 | Hansson | H05G 2/003 250/504 R |
| 2008/0237501 A1 | 10/2008 | Hosokai et al. | |
| 2010/0090133 A1 | 4/2010 | Endo et al. | |
| 2010/0181503 A1 | 7/2010 | Yanagida et al. | |
| 2010/0271610 A1* | 10/2010 | Soer | B82Y 10/00 355/67 |
| 2010/0303199 A1 | 12/2010 | Wallhead et al. | |
| 2011/0013166 A1* | 1/2011 | Loopstra | G03F 7/70033 355/67 |
| 2011/0168925 A1 | 7/2011 | Ceglio et al. | |
| 2011/0205506 A1 | 8/2011 | Bianucci et al. | |
| 2012/0307851 A1 | 12/2012 | Hori et al. | |
| 2013/0207004 A1* | 8/2013 | Ceglio | G21K 1/067 250/504 R |
| 2014/0368802 A1* | 12/2014 | Yakunin | H05G 2/008 355/67 |

FOREIGN PATENT DOCUMENTS

| | | |
|---|---|---|
| JP | 2011-142323 A | 7/2011 |
| JP | 2012-134433 A | 7/2012 |
| WO | WO 2011/069881 | 6/2011 |

OTHER PUBLICATIONS

International Preliminary Report on Patentability and Written Opinion of the International Searching Authority directed to related International Patent Application No. PCT/EP2012/066449, mailed Mar. 25, 2014; 11 pages.
Fujioka, S., et al., "Pure-tin microdroplets irradiated with double laser pulses for efficient and minimum-mass extreme-ultraviolet light source production," Applied Physics Letters, vol. 92, No. 24, 2008; pp. 241502-1 to 241502-3.
U.S. Appl. No. 13/625,398, Van Schoot et al., "Radiation Source," filed Sep. 24, 2012.
English-Language Abstract, of Japanese Patent Publication No. JP2008-270149 A, published Nov. 6, 2008; 2 pages.
Notification for Refusal (with English language translation) directed to related Japanese Patent Publication No. 2014528146 (a), mailed Aug. 3, 2016, 7 pages.
Japanese Search Report by Registered Searching Authority with English-Language translation attached directed to Japanese Patent Publication No. JP 2014-528146, issued Jul. 27, 2016; 26 pages.
English-Language Abstract of Japanese Patent Publication No. JP 2012-134433 A, published Jul. 12, 2012; 1 page.

\* cited by examiner

RADIATION SOURCE

CROSS REFERENCE TO RELATED APPLICATIONS

This application claims the benefit of U.S. provisional application 61/538,006, filed on Sep. 22, 2011 and U.S. 61/606,715, which was filed on Mar. 5, 2012 and U.S. 61/635,758, which was filed on Apr. 19, 2012 and U.S. 61/668,474, which was filed on Jul. 6, 2012 which are incorporated herein in its entirety by reference.

BACKGROUND

Field of the Invention

The present invention relates to a radiation source, suitable for use in conjunction with, or forming part of, a lithographic apparatus.

Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles (i.e., droplets) of a suitable fuel material (e.g., tin, which is currently thought to be the most promising and thus likely choice of fuel for EUV radiation sources), or a stream of a suitable gas or vapor, such as Xe gas or Li vapor. The resulting plasma emits output radiation, e.g., EUV radiation, which is collected using a radiation collector. The radiation collector may typically be a mirrored normal incidence radiation collector, which receives the radiation and focuses the radiation into a beam. The source collector module may include an enclosing structure (i.e., a housing) arranged to provide a vacuum (or low pressure) environment to support the plasma. Such a radiation system is typically termed a laser produced plasma (LPP) source. In an alternative system, which may also employ the use of a laser, radiation may be generated by a plasma formed by the use of an electrical discharge—a discharge produced plasma (DPP) source.

There are a number of problems with existing and proposed radiation sources. One problem is the effect of contamination on collecting surfaces of such sources. Another problem is the degradation or damage caused to collecting surfaces during use, which can severely limit the lifetime of the radiation source. Another problem relates to the amount of radiation that can be collected. A yet further problem with LPP radiation sources in particular is that infrared radiation used in the generation of a radiation generating plasma can pass toward and through the intermediate focus, or another focal point, of the radiation source, and thus onto and through the lithographic apparatus. The infrared radiation can heat and thus distort elements of the lithographic apparatus, which can lead to distortions or the like of patterns applied to a substrate. Alternatively or additionally, the infrared radiation may pass through the lithographic apparatus and onto to the substrate, where the infrared radiation can cause the substrate to be unintentionally and undesirably patterned.

SUMMARY

Therefore, what is needed is an improved radiation source.

In an embodiment of the present invention, there is provided a radiation source comprising:

a fuel stream generator configured to generate a fuel stream and to direct the fuel stream along a trajectory towards a plasma formation location;

a pre-pulse laser radiation assembly configured to direct a first beam of laser radiation at the fuel stream at the plasma formation location to generate, in use, a modified fuel target;

a main pulse laser radiation assembly configured to direct a second beam of laser radiation at the modified fuel target at the plasma formation location to generate, in use, a radiation generating plasma; and a collector constructed and arranged to collect radiation generated by the radiation generating plasma and to direct collected radiation along an optical axis of the radiation source; wherein:

the pre-pulse laser radiation assembly is configured to direct the first beam of laser radiation towards the fuel stream substantially along the optical axis; and the main pulse laser radiation assembly is configured to direct the second beam of laser radiation towards the modified fuel target substantially at an angle of greater than 0 degrees and less than 90 degrees with respect to the optical axis. In this way less infra-red radiation from the radiation generating plasma may be collected by the collector. Infra red radiation from the plasma may give rise to problems within a lithographic apparatus connected to the source and therefore infra red radiation filtering may be required. Filtering may decrease the EUV transmission within the apparatus. If less infra-red radiation is collected the filtering may not be necessary in the apparatus improving the EUV efficiency. A further advantage may be that debris is directed away from the collector. Debris may damage the collector and limit the lifetime of the collector.

In an embodiment, the main pulse laser radiation assembly is configured to direct the second beam of radiation towards a side of the modified fuel target that faces away from the collector.

In an embodiment, the main pulse laser radiation assembly is configured to direct the second beam of radiation towards a side of the modified fuel target that faces the collector.

In an embodiment, the main pulse laser radiation assembly is configured to direct the second beam of radiation toward the collector, and wherein the collector is provided with an aperture through which the second beam of radiation may pass, should the second beam of radiation not be incident on the fuel stream or the modified fuel target.

In an embodiment, the collector may be a normal incidence collector, and the pre-pulse laser radiation assembly is configured to direct the first beam of radiation through an aperture provided in the normal incidence collector, along the optical axis of the radiation source, in the general propagation direction of radiation generated by the by the radiation generating plasma and collected by the normal incidence collector.

In an embodiment, the collector may be a normal incidence collector, and the pre-pulse laser radiation assembly is configured to direct the first beam of radiation toward the collector, along the optical axis of the radiation source, but in an opposite direction to a general propagation direction of radiation generated by the radiation generating plasma and collected by the normal incidence collector.

In an embodiment, the collector may be a grazing incidence collector located in-between the plasma formation location and an intermediate focus, or other focal point, of the grazing incidence collector, and the pre-pulse laser radiation assembly is configured to direct the first beam of radiation through the grazing incidence collector, along the optical axis of the radiation source, but in an opposite direction to a general propagation direction of radiation generated by the radiation generating plasma and collected by the grazing incidence collector.

In an embodiment, the collector may be a grazing incidence collector located in-between the plasma formation location and an intermediate focus, or other focal point, of the grazing incidence collector, and the pre-pulse laser radiation assembly is configured to direct the first beam of radiation toward the grazing incidence collector, along the optical axis of the radiation source, in a general propagation direction of radiation generated by the radiation generating plasma and collected by the grazing incidence collector.

In an embodiment, the pre-pulse laser radiation assembly is configured to to ensure that the modified fuel target is a substantially disc shaped cloud after being hit by the first laser radiation beam and, the disc has a radius that is substantially perpendicular with respect to the optical axis. More generally, the first beam of laser radiation may be configured to ensure that the modified fuel target is elongated (with respect to a pre-modified shape) in one or more directions substantially perpendicular to the optical axis, to provide a flatter surface (with respect to a pre-modified shape) for the second beam to be incident on and/or reflect off.

In an embodiment, a debris mitigation arrangement may be located in-between the plasma formation location and the collector. The first beam of radiation, and/or the second beam of radiation, may pass through the collector and/or the debris mitigation arrangement before being incident on the fuel target/modified fuel target.

In an embodiment, the fuel stream generator may comprise: a reservoir configured to retain a volume of fuel; and a nozzle, in fluid connection with the reservoir, and configured to direct the fuel stream along the trajectory towards the plasma formation location.

In an embodiment, the stream of fuel may comprise a stream of droplets of fuel.

In an embodiment, the fuel may be a molten metal, such as tin.

According to a further embodiment a lithographic apparatus comprising, or in connection with, the radiation source as described above may be provided.

According too yet a further embodiment there is provided a radiation source comprising:

a fuel stream generator configured to generate a fuel stream and to direct the fuel stream along a trajectory towards a plasma formation location;

a pre-pulse laser radiation assembly configured to direct a first beam of laser radiation at the fuel stream at the plasma formation location to generate a modified fuel target;

a main pulse laser radiation assembly configured to direct a second beam of laser radiation at the modified fuel target at the plasma formation location to generate a radiation generating plasma; wherein the radiation source comprises:

a grazing incidence collector configured to collect radiation generated by the radiation generating plasma and to direct collected radiation along an optical axis of the radiation source; and, the pre-pulse laser radiation assembly is configured to direct the first beam of laser radiation towards the fuel stream substantially along the optical axis.

In this way less infra-red radiation from the radiation generating plasma may be collected in the radiation by the collector. A further advantage may be that debris is directed away from the collector. Debris may damage the collector and limit the lifetime of the collector.

In an embodiment, a debris mitigation arrangement may be located in-between the plasma formation location and the grazing incidence collector. In an embodiment, the first and/or second beam of radiation may pass through the debris mitigation arrangement.

In an embodiment, the debris mitigation arrangement may be a stationary or rotatable foil trap. In an embodiment, the pre-pulse laser radiation assembly is configured to direct the first beam of laser radiation, and/or the main pulse laser radiation assembly is configured to direct the second beam of laser radiation, along and through a hollow axis of the foil trap.

In an embodiment, the main pulse laser radiation assembly is configured to direct the second beam of laser radiation toward the modified fuel target substantially along the optical axis, and in the same direction to that of the first beam of radiation.

In an embodiment, the main pulse laser radiation assembly is configured to direct the second beam of laser radiation toward the modified fuel target substantially along the optical axis, and in an opposite direction to that of the first beam of radiation.

In an embodiment, the main pulse laser radiation assembly is configured to direct the second beam of laser radiation toward the modified fuel target substantially at an angle of greater than 0 degrees and less than 90 degrees with respect to the optical axis.

The main pulse laser radiation assembly is configured to direct the second beam of laser radiation toward the modified fuel target substantially at an angle of 90 degrees with respect to the optical axis.

In an embodiment, the pre-pulse laser radiation assembly is configured to direct the first beam of radiation and/or the main pulse laser radiation assembly is configured to direct the second beam of radiation through the grazing incidence collector, along the optical axis of the radiation source, but in an opposite direction to a general propagation direction of radiation generated by the radiation generating plasma and collected by the grazing incidence collector.

In an embodiment, the pre-pulse laser radiation assembly is configured to direct the first beam of radiation and/or the main pulse laser radiation assembly is configured to direct the second beam of radiation toward the grazing incidence collector, along the optical axis of the radiation source, in a general propagation direction of radiation generated by the radiation generating plasma and collected by the grazing incidence collector.

In an embodiment, the pre-pulse laser radiation assembly is configured to direct the first beam of radiation and/or the main pulse laser radiation assembly is configured to direct the second beam of radiation toward a side of the fuel stream or modified fuel target that faces away from the grazing incidence collector.

In an embodiment, the pre-pulse laser radiation assembly is configured to direct the first beam of radiation and/or the main pulse laser radiation assembly is configured to direct the second beam of radiation second beam of radiation toward a side of the fuel stream or modified fuel target that faces the grazing incidence collector.

In an embodiment, the pre-pulse laser radiation assembly is configured to direct the first beam of radiation and/or the main pulse laser radiation assembly is configured to direct the second beam of radiation toward the grazing incidence collector. In an embodiment, the grazing incidence collector may be provided with an aperture through which the first and/or second beam of radiation may pass, should the first and/or second beam of radiation not be incident on the fuel stream or the modified fuel target.

In an embodiment, the grazing incidence collector may be located in-between the plasma formation location and an intermediate focus, or other focal point, of the grazing incidence collector.

In an embodiment, the fuel stream generator may comprise one or more of, or a combination of: a reservoir configured to retain a volume of fuel; and a nozzle, in fluid connection with the reservoir, and configured to direct the fuel stream along the trajectory towards the plasma formation location.

In an embodiment, the stream of fuel may comprise a stream of droplets of fuel.

In an embodiment, the pre-pulse laser radiation assembly is configured to ensure that the modified fuel target is a substantially disc shaped cloud after being hit by the first laser beam and the disc having a radius that is substantially perpendicular with respect to the optical axis. In an embodiment, the first beam of laser radiation may be configured to ensure that the modified fuel target is elongated in a direction substantially perpendicular with respect to the optical axis. The modified fuel target may provide a flatter, wider or larger target than the part of the fuel stream on which the first laser beam is incident.

In an embodiment of the present invention, there is provided a lithographic apparatus that includes, or is in connection with, any of the radiation sources described above. The lithographic apparatus might also optionally include one or more of: an illumination system for providing a radiation beam; a patterning device for imparting the radiation beam with a pattern in its cross-section; a substrate holder for holding a substrate; a projection system for projecting the patterned radiation beam onto a target portion of the substrate.

In any embodiment, the optical axis of the radiation source that is referred to (e.g., along, or relative to, a radiation beam may be directed) may be an optical axis of the collector of the radiation source.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, that are incorporated herein and form part of the specification, illustrate the present invention, and, together with the description, further serve to explain the principles of the invention and to enable a person skilled in the relevant art(s) to make and use the invention.

Figure 1:
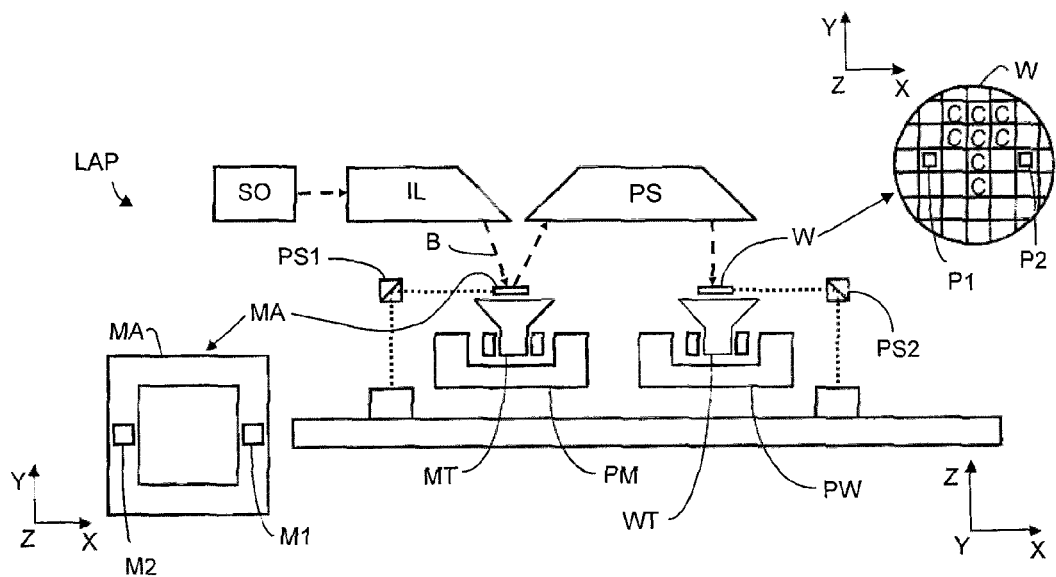
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which may be read and executed by one or more processors. A machine-readable medium can include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1, according to an embodiment of the present invention, schematically depicts a lithographic apparatus LAP including a source collector module SO. The apparatus includes an illumination system (illuminator) IL configured to condition a radiation beam B (e.g., EUV radiation), a support structure (e.g., a mask table) MT constructed to support a patterning device (e.g., a mask or a reticle) MA and connected to a first positioner PM configured to accurately position the patterning device, a substrate table (e.g., a wafer table) WT constructed to hold a substrate (e.g., a resist-coated wafer) W and connected to a second positioner PW configured to accurately position the substrate, and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

In this embodiment, for example, the apparatus is of a reflective type (e.g., employing a reflective mask).

The lithographic apparatus may be of a type having two (dual stage) or more substrate tables and for example, two or more mask tables. In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of a EUV radiation system including a laser, not shown in FIG. 1, for providing the laser beam and exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent, which are commonly referred to as σ-outer and σ-inner, respectively, of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
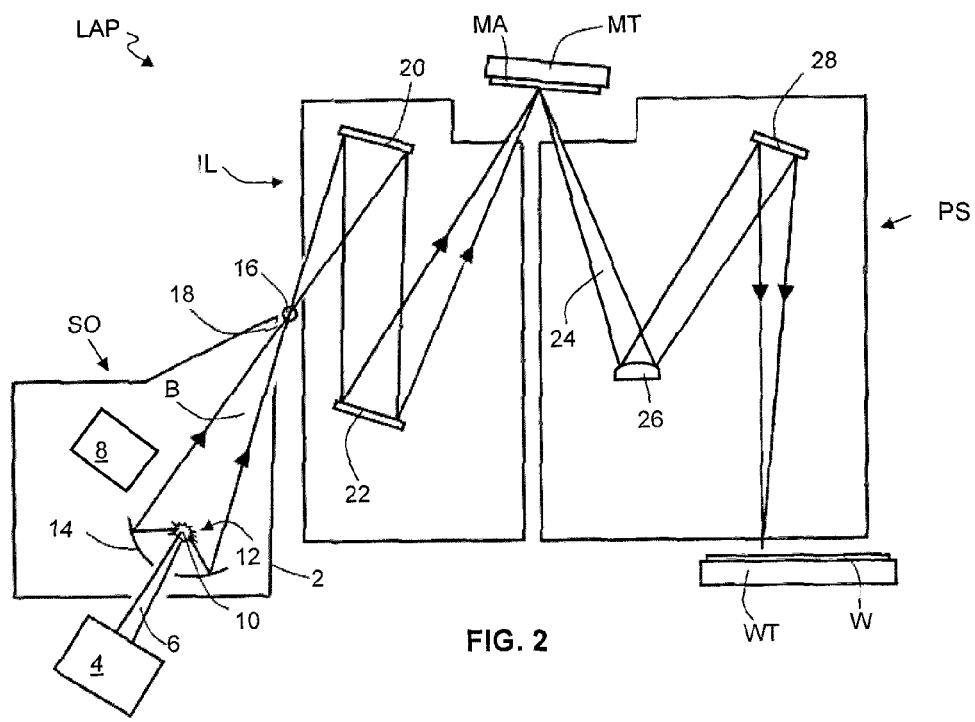
FIG. 2 is a more detailed view of the apparatus of FIG. 1, including an LPP source collector module, according to an embodiment of the present invention.

FIG. 2, according to an embodiment of the present invention, shows the lithographic apparatus LAP in more detail, including the source collector module SO, the illumination system IL, and the projection system PS. The source collector module SO is constructed and arranged such that a vacuum environment can be maintained in an enclosing housing 2 of the source collector module.

A laser 4 is arranged to deposit laser energy via a laser beam 6 into a fuel, such as xenon (Xe), tin (Sn) or lithium (Li) that is provided from a fluid stream generator 8. Liquid (i.e., molten) tin, which can be in the form of droplets, or another metal in liquid form, appears to be the most promising and thus likely choice of fuel for EUV radiation sources. The deposition of laser energy into the fuel creates a highly ionized plasma 10 at a plasma formation location 12 that has electron temperatures of several tens of electronvolts (eV). The energetic radiation generated during de-excitation and recombination of these ions is emitted from the plasma 10, collected and focused by a near normal incidence radiation collector 14. Alternatively a grazing incidence collector may be used. A laser 4 and fluid stream generator 8 (and/or a collector 14) can together be considered to comprise a radiation source, specifically a EUV radiation source. The EUV radiation source can be referred to as a laser produced plasma (LPP) radiation source.

In an embodiment, a second laser (not shown in this embodiment) can be provided, the second laser being configured to preheat the fuel before the laser beam 6 is incident upon it. An LPP source that uses this approach may sometimes be referred to as a dual laser pulsing (DLP) source. LPP sources using this approach are discussed in later embodiments.

Although not shown, the fuel stream generator will comprise, or be in connection with, a nozzle configured to direct a stream of, for example, fuel droplets along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing housing 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

In an embodiment, additional elements can be present in the illumination system IL and projection system PS. Furthermore, there may be more mirrors present than those shown in the figures, for example there may be 1-6 additional reflective elements present in the projection system PS (in addition to the elements shown in FIG. 2).

Radiation sources (e.g., EUV radiation sources), both existing and proposed, typically take the form of an LPP radiation source having a normal incidence collector, or a DPP radiation source having a grazing incidence collector. However, despite vast resources being invested in such radiation sources, numerous problems still exist with their design and operation.

When normal incidence collectors are used in an LPP radiation source, their lifetime (and therefore an associated lifetime of the radiation source as a whole, or at least an operating time) is limited by a number of mechanisms, for example deposition of fuel (e.g., tin) debris at or on the collector surface, which can result in increased EUV absorption at the collector surface. Another limitation is caused by degradation of the collector surface itself. For instance, the collector surface may be or comprise a multilayer stack (e.g., a MoSi multilayer stack), and this stack can be readily implanted with atomic hydrogen or ions of the fuel used (e.g., during or after plasma formation), which can also lead to a degradation in optical performance (i.e., reflectance of EUV radiation). Another problem is that the different materials forming the multilayer stack may intermix at their boundaries, also resulting in degradation in reflectance. As well as ions potentially implanting into the collector surface, the collector surface (e.g., comprising a multilayer or the like) may also be at least partially sputtered by highly energetic ions of the fuel, when and after the plasma is generated.

As discussed, an alternative collector used in a DPP radiation source is a grazing incidence collector. These grazing incidence collectors do not typical suffer from the degradation mechanisms associated with normal incidence collectors. However, at the present time such collectors have not been considered as truly suitable for use in an LPP radiation source.

Figure 3:
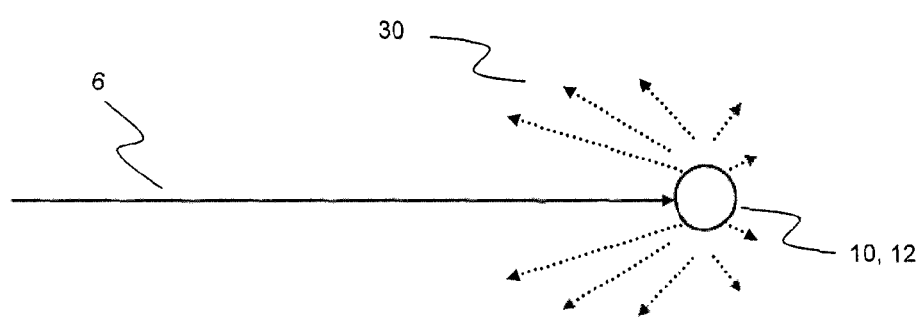
FIG. 3 schematically depicts a general direction of propagation of EUV radiation generated when a fuel droplet is targeted by laser radiation, according to an embodiment of the present invention.

FIG. 3, according to an embodiment, illustrates laser radiation 6 that has been directed towards a droplet of fuel (not shown) to generate a radiation generating plasma 10 at a plasma formation location 12. EUV radiation 30 is generated by the radiation generating plasma 10. However, EUV radiation 30 that is generated does not have an isotropic distribution. Instead, the distribution is anisotropic, and EUV radiation 30 preferentially propagates in a direction back from where laser radiation 6 originated. In other words, the majority of the EUV radiation 30 that is generated has a component in a direction opposite to the direction in which the laser radiation 6 was directed at the fuel droplet. Typically, at least in DPP radiation sources, a grazing incidence collector is located downstream of the plasma formation location. However, if such a grazing incidence collector was to be used with an LPP radiation source, with the collector located downstream of the laser beam used in the generation of the plasma, it can be seen from FIG. 3 that the grazing incidence collector would not collect the majority of EUV radiation that is generated 30.

It is desirable to provide an LPP radiation source that has a collector arrangement which does not suffer from the problems discussed above in relation to a normal incidence collector. At the same time, it is desirable to ensure that the radiation source has the advantages associated with a grazing incidence collector. All this is to be achieved whilst, at the same time, ensuring that as much EUV radiation as possible is collected, for example for use in lithographic processes, or the like.

According to an embodiment of the present invention, the abovementioned problems may be obviated or mitigated, and the abovementioned desires at least partially realised. An embodiment of the present invention provides an LPP radiation source. The radiation source comprises a fuel stream generator configured to generate a fuel stream (e.g., a stream of droplets) and to direct the fuel stream along a trajectory towards a plasma formation location. A laser radiation assembly is provided, and is configured to direct radiation in a first direction at the fuel stream at the plasma formation location to generate a radiation generating plasma. An embodiment of the present invention may be distinguished from existing and proposed radiation sources as including a grazing incidence collector. The grazing incidence collector is constructed and arranged (which includes located) to collect radiation generated by the radiation generating plasma that has a propagation direction with a component opposite to the first direction. In other words, the grazing incidence collector is constructed and arranged (which, again, includes located) to collect radiation that is directed, or has a component in the direction of, back from where the laser beam is generated. In accordance with an embodiment of the present invention, this radiation source ensures that the problems of a normal incidence collector are no longer present, while the properties of a grazing incidence collector are incorporated. At the same time, the construction and arrangement of the grazing incidence collector allows a significant amount of EUV radiation generated to be collected (or at least an increased amount of EUV radiation, in comparison with if the grazing incidence collector was located downstream of the direction of laser radiation).

Figure 4:
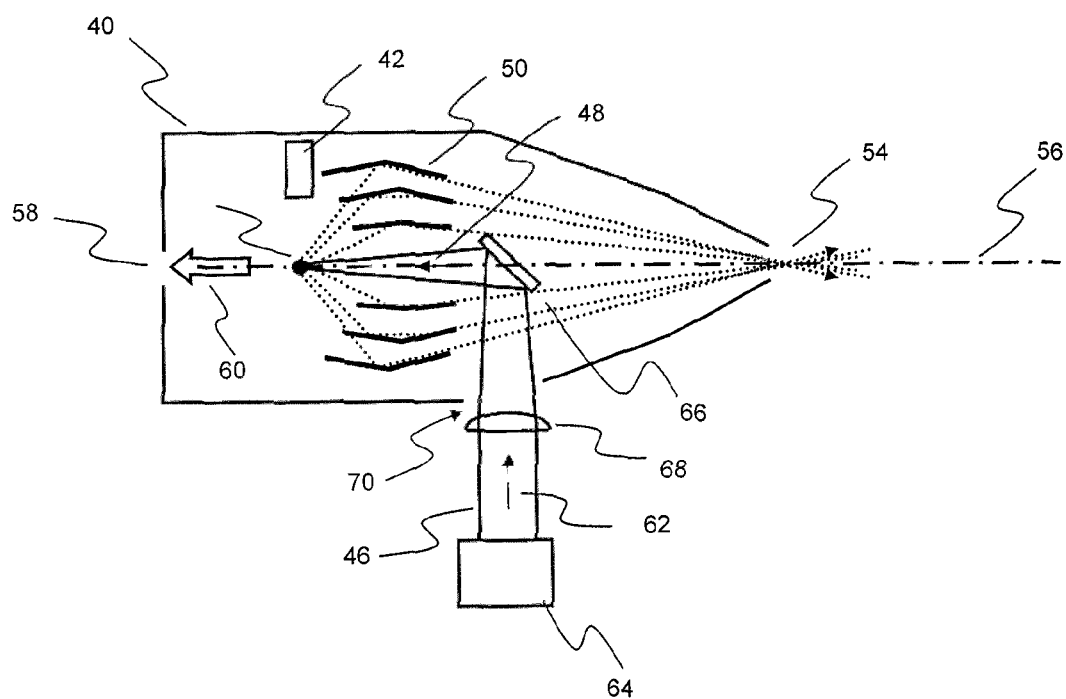
FIG. 4 schematically depicts a radiation source, according to an embodiment of the present invention.

FIG. 4, according to an embodiment, illustrates an example radiation source. The radiation source comprises a housing 40. Located within housing 40 is a fuel stream generator 42 configured to generate a fuel stream (e.g., a stream of droplets) and to direct the fuel stream along a trajectory towards a plasma formation location 44. Although not shown, the fuel stream generator may comprise a reservoir configured to retain a volume of fuel, and a nozzle, in fluid connection with the reservoir, configured to direct the fuel stream along the trajectory towards the plasma formation location 44. In an embodiment, the radiation source further comprises a laser radiation assembly (described in more detail below) configured to direct laser radiation 46 along, ultimately, a first direction 48 at the fuel stream at the plasma formation location 44.

Also located within housing 40, according to an embodiment, is a grazing incidence collector 50, constructed and arranged, including the location, to collect radiation 52 generated by the radiation generating plasma that has a propagation direction with a component opposite to the first direction 48.

In an embodiment, the grazing incidence collector 50 is located in-between the plasma formation location 44 and an intermediate focus 54 (or other focal point) of the grazing incidence collector 50. The first direction 48 is substantially along an optical axis of the radiation source 56, but in an opposite direction to a general propagation direction of radiation generated by the radiation generating plasma 52 and collected by the grazing incidence collector 50. This ensures that the radiation that is collected is radiation that preferentially propagates in a direction substantially opposite to first direction 48 in which the laser beam 46 is incident on the fuel stream. This thus allows for a potentially increased amount of radiation 52 to be collected, in accordance with the principles shown in and describe with reference to FIG. 3.

The grazing incidence collector 50 (e.g., one or more concentric shells thereof) at least partially surrounds a beam path of the laser radiation 46, such that the laser radiation 46 passes through the grazing incidence collector 50 before being incident on the fuel stream. This facilitates the targeting of the fuel from the first direction, which allows the collector 50 to collect the radiation that preferentially propagates in the opposite direction. Indeed, it can be seen that the first direction 48 extends through the grazing incidence collector 50. Furthermore, it can be seen that the first direction 48 is substantially along (e.g., parallel to and along) a longitudinal axis of symmetry of the grazing incidence collector 50, which can coincide with the optical axis 56. This again facilitates a collection of a large amount of radiation 52 that preferentially propagates in an opposite direction to the first direction 48.

On an opposite side of the plasma formation location 44 to the grazing incidence collector 50 (e.g., downstream of the first direction 48), there is provided in this embodiment an aperture or window 58. This window or aperture 58 may facilitate one of a number of functions, for example extraction of fuel debris 60, which includes contamination, or the like which preferentially has a propagation direction with a component along the first direction 48. Alternatively or additionally, one or more inspection apparatus may be provided for inspecting the plasma formation location 44 or the like through this window or aperture 58. Alternatively or additionally, a laser beam dump, and/or debris, which includes contamination, mitigation arrangement and/or a debris, includes contamination, trap may be located in substantially the same location, either to mitigate or trap debris or to provide a convenient location to stop (e.g., absorb) or appropriately direct any remaining laser radiation 46 that has not been used in the generation of the radiation generating plasma.

In order to achieve the directing of the laser radiation 46 in the manner described in FIG. 4, the laser radiation assembly may be configured, in an embodiment, to initially direct laser radiation 46 in a second direction 62 so that the laser radiation 46 is re-directed along the first direction 48. This may allow parts of the laser radiation assembly to be located away from the collector 50, while facilitating the delivery of laser radiation 46 through the collector 50. The laser radiation assembly may comprise a laser 64 and one or more appropriate re-directing configurations 66 for re-directing the laser radiation 46 in the manner described (e.g., in the first direction 48). The re-directing configuration may be appropriately located in an obscuration or shadow of another component of the radiation source, such that the presence of the re-directing configuration 46 does not reduce the amount of EUV radiation that may be collected or appropriately directed further downstream.

In an embodiment, the laser radiation assembly can further comprise focusing optics 68 for focusing the laser radiation 46 onto the fuel stream at the plasma formation location 44. In the embodiment shown in FIG. 4, a lens 68 is provided for achieving this focusing. In another embodiment (not shown), the re-directing element 66 itself may provide at least a portion of this focusing functionality.

Although in this embodiment most contamination and debris and the like will be generated along the first direction 48, and away from the collector 50 and the like, it may still be desirable to provide a buffer or the like for preventing contamination reaching and/or contaminating the re-directing arrangement 66. To achieve this, a gas flow generator (not shown) may be provided for generating a gas flow and for directing the gas flow toward or across the re-directing configuration, thus preventing contamination being incident and/or deposited on the re-directing configuration 66, or to remove contamination or debris from the re-directing arrangement 66.

The re-directing configuration may be any appropriate configuration, for example comprising one or more of a lens, a mirror and/or a prism.

The laser radiation 46 may be appropriately directed into the housing 40 via a window or aperture or the like 70, so that the laser may be located outside of the housing 40.

Where the term "aperture" has been used, this may be a sealed aperture, to ensure that a vacuum environment may be maintained within the housing 40 during use.

In a typical LPP radiation source, the (usually infrared) radiation beam that is incident on a portion of a fuel stream (e.g., a droplet of fuel) to generate a radiation generating plasma may not be totally absorbed by the portion of the fuel stream. Instead, some of the infrared radiation used to generate the radiation generating plasma may pass the location of the portion of the fuel stream, or be scattered by the portion of the fuel stream. Usually the radiation beam is directed towards the fuel stream along an optical axis of the radiation source, which readily allows any radiation not being absorbed by the fuel stream to pass through the intermediate focus of the radiation source and onto and through the lithographic apparatus. It is known, in an alternative arrangement, to direct the radiation beam at the fuel stream at an angle perpendicular to the optical axis of the radiation source. Although radiation passing the location of the fuel stream may no longer pass through intermediate focus, radiation scattered off the fuel may still pass through an intermediate focus.

The above problem could be partially obviated or mitigated by using a spectral purity filter, for example in the vicinity of or at an intermediate focus. A spectral purity filter may limit or prevent the propagation of infrared radiation into the lithographic apparatus (e.g., an illuminator thereof), but at the same time the spectral purity filter may reduce the amount of EUV radiation (or whatever radiation is generated by the radiation generating plasma) that passes into the lithographic apparatus (e.g., an illuminator thereof). This is undesirable, since a reduction in EUV radiation, for example, can reduce throughput. It is thus desirable to avoid the use of a spectral purity filter.

Figure 5:
FIG. 5 depicts a first beam of laser radiation directed at a fuel stream.
Figure 6:
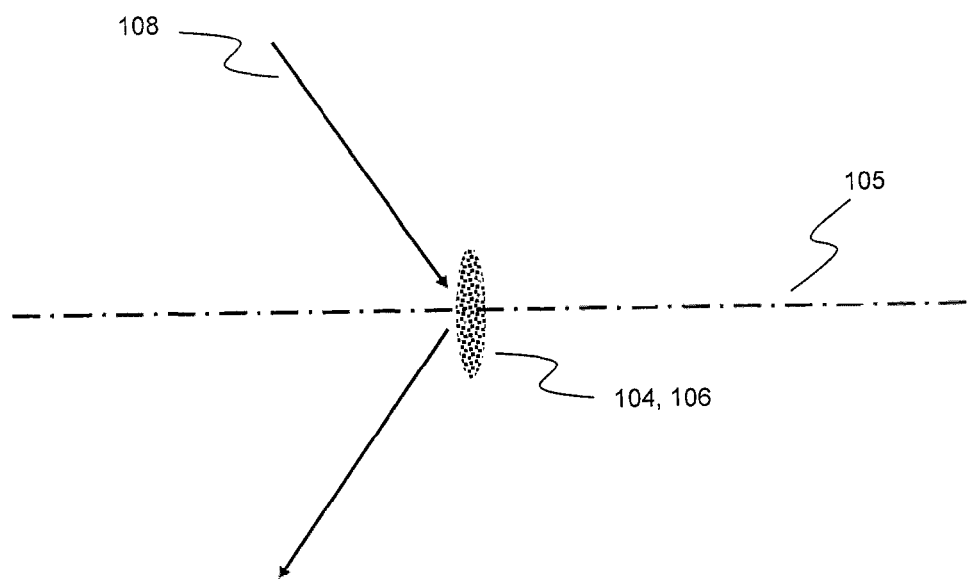
FIG. 6 depicts a modified fuel target at a plasma formation position.

According to an embodiment of the present invention, the abovementioned problems may be at least partially obviated or mitigated. FIGS. 5 and 6 depict principles used by the present invention. FIG. 5 shows that a first beam of laser radiation 100 is directed at the fuel stream 102 (e.g., a droplet thereof) at a plasma formation location 104. This first beam of laser radiation 100 may be referred to as a "pre-pulse"). This first beam of laser radiation 100 generates, in use, a modified fuel target. FIG. 6 shows a modified fuel target 106 at the plasma formation location 104. The modified fuel target 106 is, compared with a droplet 102, relatively elongate, flattened and/or disk-like shaped, and may consist of a plurality of smaller droplets (for example, a mist or the like).

Once the modified fuel target 106 has been generated, a second beam of laser radiation 108 (sometimes referred to as a "main pulse") is directed at the modified fuel target 106 at the plasma formation location 104 to generate, in use, a radiation generating plasma.

Referring to FIGS. 5 and 6 in combination, the first beam of laser radiation 100 is directed towards the fuel stream 102 substantially along an optical axis of the radiation source. This ensures that the subsequently generated modified fuel target 106 is elongate in a direction substantially perpendicular to the optical axis, as shown in FIG. 6. This may be advantageous, since when a second beam of radiation 108 is incident on the modified fuel target 106 (in general, regardless of the angle of incidence), the shape and orientation of the target 106 will ensure that the radiation generating plasma generates EUV radiation in a direction substantially perpendicular to the direction of elongation of the target 106—i.e., along the optical axis 105. The second beam of laser radiation may be directed toward the modified fuel target substantially at an angle of greater than 0° (that is, not parallel to the optical axis 105) and less than 90° with respect to the optical axis (that is, not perpendicular with respect to the optical axis 105). As can be seen in FIG. 6, any radiation constituting the second beam 108 that is not used in the generation of the plasma is reflected in a relatively controlled manner away from the plasma formation location 104. Reflection is encouraged or promoted due to the relatively elongate, flattened and/or disk-like shape of the modified fuel target 106. This controlled reflection may reduce scattering, and at the very least allow a degree of control over the direction in which reflected laser beam radiation 108 is directed. This, in turn, can allow for the suppression of radiation passing through, for example, an intermediate focus of the radiation source. This suppression may be achieved by, for example, directing the reflected radiation away from the focus, or from a collector with that focus.

Practical embodiments of the principles shown in and described with reference to FIGS. 5 and 6 will now be discussed in relation to FIGS. 7 to 13.

Figure 7:
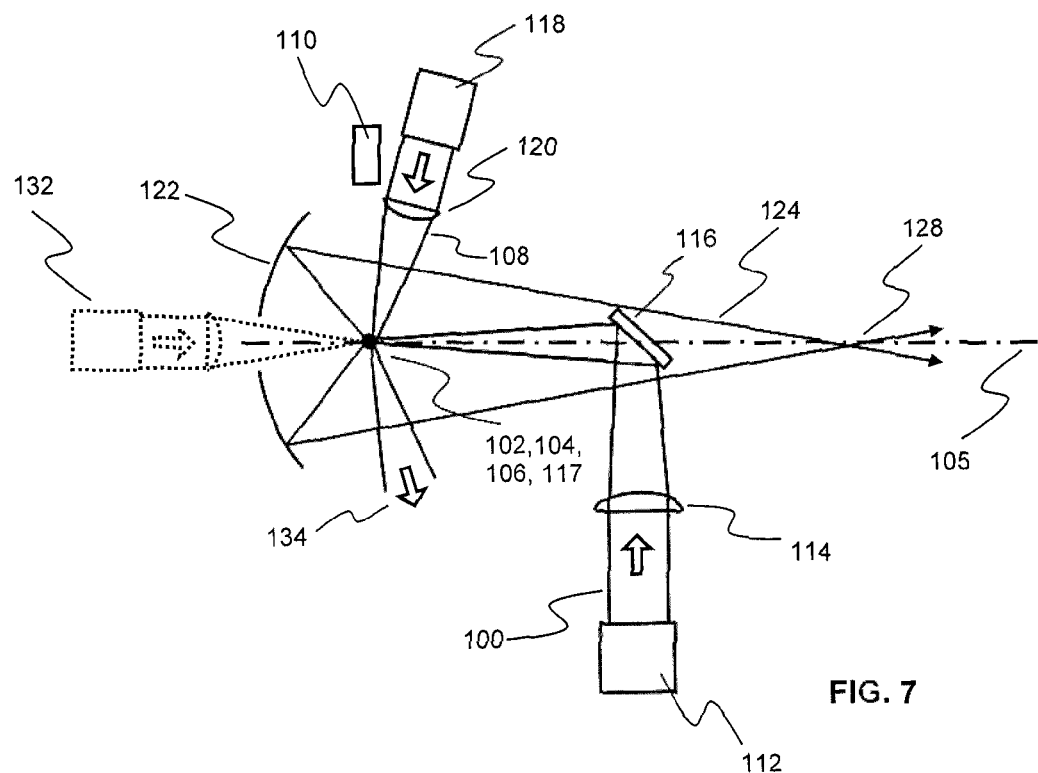
FIG. 7 schematically depicts a radiation source, according to an embodiment of the present invention.

FIG. 7 schematically depicts a radiation source according to an embodiment of the present invention. The radiation source comprises a fuel stream generator 110 (e.g., a droplet generator) configured to direct a fuel stream 102 towards a plasma formation location 104. A pre-pulse laser radiation assembly is provided, and is configured to direct a first beam of laser radiation 100 (e.g., infrared radiation) at the fuel stream 102 at the plasma formation location 104 to generate, in use, a modified fuel target 106. The pre-pulse laser radiation assembly may comprise a first laser 112, a lens or focusing arrangement 114 and, in this example, a mirror 116 (which may have focusing functionality) for directing the first beam of laser radiation 100 at the fuel stream 102 at the plasma formation location 104. In use, a modified fuel target 106 is provided at the plasma formation location 104, as discussed in relation to FIGS. 5 and 6.

Referring back to FIG. 7, the radiation source further comprises a main pulse laser radiation assembly configured to, subsequently, direct a second beam of laser radiation 108 (e.g., infrared radiation) at the modified fuel target 106 at the plasma formation location 104 to generate, in use, a radiation generating plasma 117. The main pulse laser radiation assembly may comprise, for example, a second laser 118 and focusing optics 120. The second laser beam 108 will usually deliver more energy than the first laser beam 100.

In use, the second beam of laser radiation 108 causes a radiation generating plasma 117 to be generated at the plasma formation location 104, which, in turn, causes radiation (e.g., EUV radiation) to be emitted by the plasma 117. A normal incidence collector 122 is provided to collect radiation generated by the radiation generating plasma 117 and to direct collected radiation 124 along an optical axis 105 of the radiation source.

As discussed above, the first beam of laser radiation 100 is directed towards the fuel stream 102 substantially along the optical axis 105. In this embodiment, the first beam of radiation 100 is also directed toward the collector 122, along the optical axis 105 of the radiation source, but in an opposite direction to a general propagation direction of radiation 124 collected and focused by the collector 122. This may be advantageous, since any portion of the first beam of radiation 100 that is back-scattered from the fuel stream 102 (which is possible in practice) will, in general, not be collected and focused by the collector 122 through the intermediate focus and onto and through the lithographic apparatus (e.g., an illuminator thereof).

Another approach for introducing the first beam of laser radiation would be through an aperture 130 provided in the collector 122, along the optical axis 105 and in a general propagation direction of radiation 124 collected and focused by the collector 122. Such an alternative is shown in dashed outline 132, in which any back-scattered radiation may be collected and focused by the collector 122 through the intermediate focus 128.

FIG. 7 also shows that the second beam of laser radiation 108 is directed towards the modified fuel target 106 substantially at an angle of greater than 0° and less than 90° with respect to the optical axis 105. This promotes or encourages relatively controlled reflection 134 of any radiation not used in the formation of the radiation generating plasma 117. The reflection can be seen as not being toward the collector 122 and/or through the intermediate focus 128, thus limiting the amount of such radiation that passes through the lithographic apparatus and onto, for example, the substrate or the like.

The arrangement shown in FIG. 7 is further advantageous since the second beam of laser radiation 108 is directed towards a side of the modified fuel target 108 that faces away from the normal incidence collector 122. Thus, even if any portion of the second beam of radiation 108 is scattered, such scattering is likely to be directed away from the collector 122, thus preventing any such scattered radiation from passing through the intermediate focus 128 of the radiation source.

Figure 8:
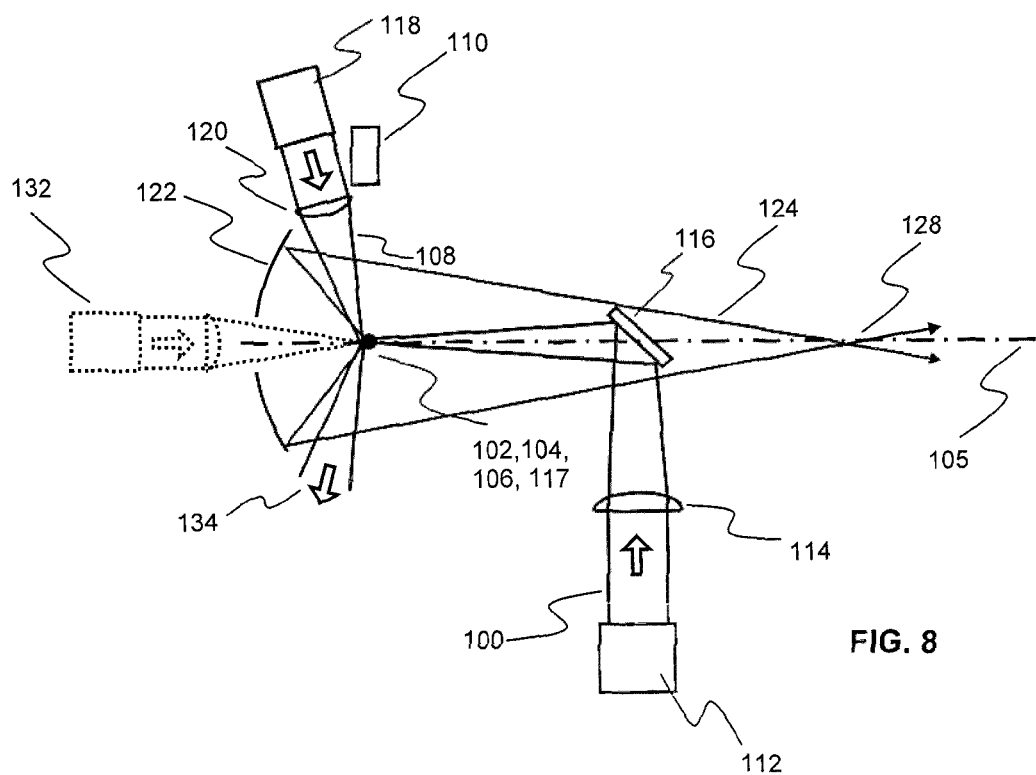
FIG. 8 schematically depicts a radiation source, according to an embodiment of the present invention.

FIG. 8 shows much a similar arrangement to that shown in and described with reference to FIG. 7. However, in FIG. 8, and in contrast to FIG. 7, the second beam of laser radiation 108 is now shown as being directed towards a side of the modified fuel target 106 that faces the normal incidence collector 122. Any portion of the second beam of radiation 108 that is scattered off the modified fuel target 106 may be directed toward the collector 122, thus allowing such scattered radiation to be collected and focused to the intermediate focus 128 of the radiation source.

Figure 9:
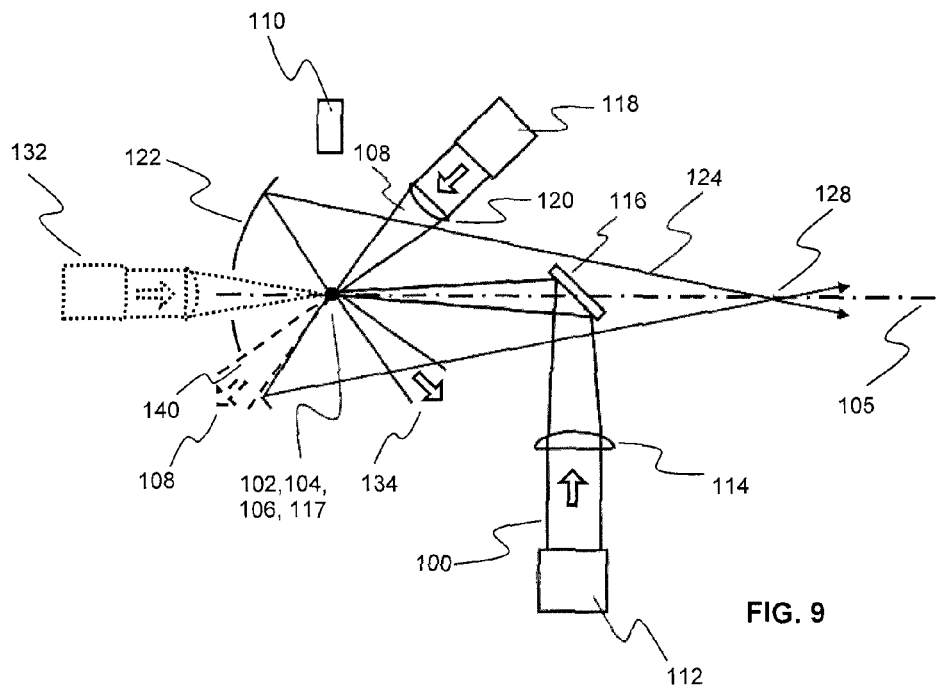
FIG. 9 schematically depicts a radiation source, according to an embodiment of the present invention.

FIG. 9 shows a further embodiment. The embodiment shown is similar to that shown in and described with reference to FIG. 7. However, in FIG. 9, the second beam of laser radiation is now directed at the modified fuel target 106 at a shallower angle with respect to the optical axis 105. A result of this is that if the second beam of laser radiation 108 is not incident (or fully incident) on the fuel stream 102 or modified fuel target 106, at least a portion of the second beam of laser radiation 108 may propagate towards the collector 122. Thus, in this embodiment, the collector is provided with an aperture 140 through which the second beam of radiation may (indicated in dashed outline) pass, should the second beam of laser radiation 108 not be incident on the fuel stream 102 or the modified fuel target 106. This may occur due to a mistiming between droplet generation and/or position and laser firing, or when no fuel is being provided. In the absence of the aperture 140, the second beam of laser radiation would otherwise be collected and focused by the normal incidence collector 122 and passed onto and through the intermediate focus 128, and thus onto and into the lithographic apparatus as a whole.

The principles discussed above do not apply only to LPP radiation sources in which a normal incidence collector is used. Alternatively or additionally, the principles may be applied to an LPP radiation source in which a grazing incidence collector is used, (for example in a radiation source having one or more features of the source discussed above in relation to FIG. 4). Such embodiments are shown in FIGS. 10, 11, 12 and 13.

A first, main difference between the embodiments shown in FIGS. 7 to 9 and those shown in FIGS. 10 to 13 is that in the embodiments shown in FIGS. 10 to 13 a grazing incidence collector 150 is shown (as opposed to a normal incidence collector). Another difference is a preferred direction of propagation of the first beam of radiation 100 when incident on the fuel stream 102, and a preferred side from which the second beam of radiation 108 is incident on the modified fuel target 106. These differences will now be described.

Figure 10:
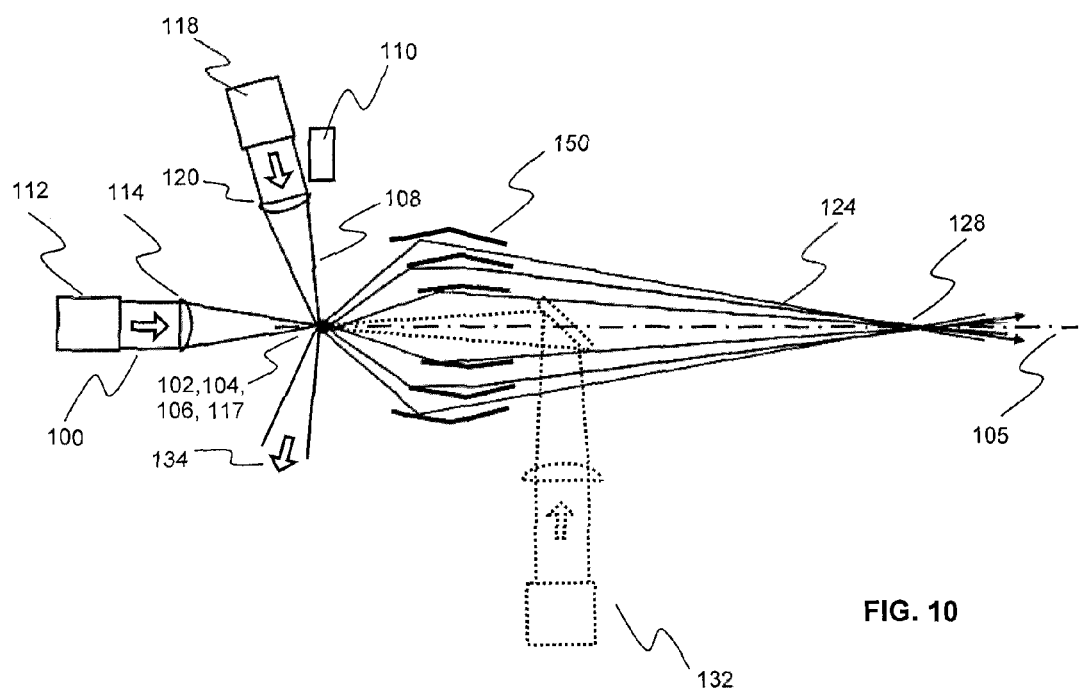
FIG. 10 schematically depicts a radiation source, according to an embodiment of the present invention.

In FIG. 10, the collector 150 is now a grazing incidence collector, comprising a number of concentric (i.e., nested) shells. The second beam of radiation 108 is again directed toward a side of the modified fuel target 108 that faces away from the collector 150, to limit any scattered radiation being collected by the collector 150. However, the angle of incidence is now substantially opposite to that shown in relation to the source of FIG. 7, which source comprised a normal incidence collector. The difference is attributable to the grazing incidence collector 150 of FIG. 10 being located in-between the plasma formation location 104 and the intermediate focus 128. Similarly, the preferred direction of propagation of the first beam of radiation 100 is also reversed, such that the first beam of radiation 100 is directed towards the grazing incidence collector 150, substantially along the optical axis 105 in a general propagation direction of radiation 124 collected by the grazing incident collector 150. The reason for this is that, again, any back-scattered radiation of the first beam of radiation 100 is not directed towards and collected by the grazing incidence collector 150.

Another alternative is shown in dashed outline 132, where the first beam of radiation is directed through the grazing incidence collector (e.g., at least partially along a longitudinal axis thereof), along the optical axis of the radiation source, but in an opposite direction of the general propagation direction of radiation 124 collected by the grazing incidence collector 150. Any back-scattered radiation constituting the first beam of radiation 100 may be collected by the grazing incidence collector 150 and passed on to and through the intermediate focus 128.

Figure 11:
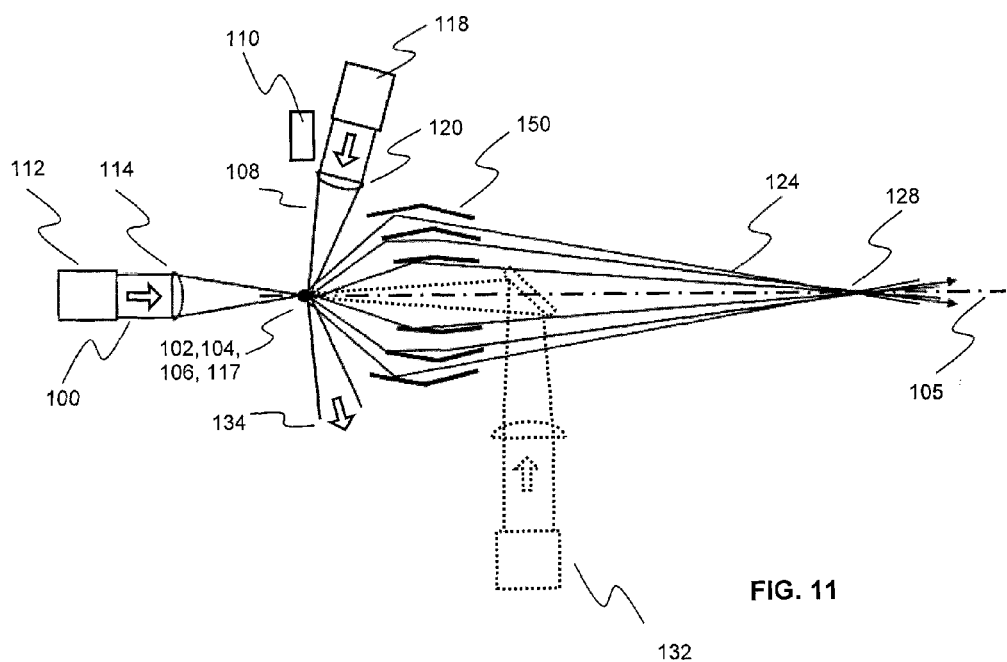
FIG. 11 schematically depicts a radiation source, according to an embodiment of the present invention.

FIG. 11 shows a similar embodiment to that shown in FIG. 10, but where the second beam of radiation 108 has an angle of incidence on the modified fuel target 108 that is substantially opposite to that shown in FIG. 10, and in particular where the second beam of radiation 108 is directed towards a side of the modified fuel target 106 that faces toward the collector 150. Any radiation constituting the second beam of radiation 108 that is back-scattered or the like off the modified fuel target 106 may be collected by the grazing incidence collector 150 and focused into and through the intermediate focus 128.

Figure 12:
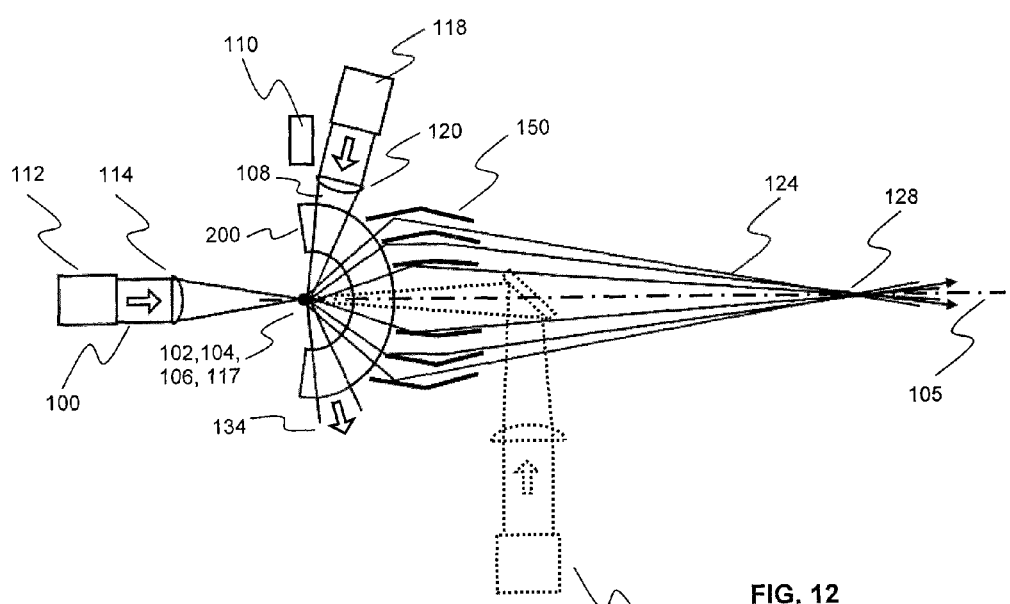
FIG. 12 schematically depicts a radiation source with a debris mitigation arrangement, according to an embodiment of the present invention.

As previously described, radiation generated at the plasma formation location will not be generated with an isotropic distribution. Instead, the distribution is anisotropic, and generated radiation preferentially propagates in a direction back from where the second (main) beam of radiation laser radiation originated. This means that the arrangement of FIG. 11, or indeed of FIG. 8, might allow more radiation generated at the plasma formation location to be collected for use in patterning a substrate. However, and at the same time, particulate contamination created during generation of the plasma (or the like) might also have an anisotropic propagation distribution, there being more contamination propagating toward the collector. This problem can be obviated or mitigated by the provision of a debris mitigation arrangement in-between the plasma formation location and the collector. FIG. 12 depicts an embodiment in which the problem is obviated or mitigated.

FIG. 12 shows another embodiment, which is similar to the embodiment shown in the FIG. 11, but which now includes a debris mitigation arrangement 200 located in-between the plasma formation location 104 and the grazing incidence collector 150. The debris mitigation arrangement 200 is used to prevent, or to limit the amount of, contamination that is able to pass onto and/or through the collector 150.

The second beam of radiation 108 may be directed through the debris mitigation arrangement 200 (as shown in FIG. 12). The second beam of radiation 108 may also be directed through the collector 150. One or both of these features may allow for the design of the source as a whole to be more compact, and/or to facilitate the directing of the second beam of radiation 108 towards a side of the modified fuel target 106 that faces toward the collector 150. At the same time, this arrangement allows for the debris mitigation arrangement 200 to be used in-between the plasma formation location 104 and the grazing incidence collector 150. Although not shown in the Figure, one or more mirrors or other optical elements may be used to direct the second beam of laser radiation 108 through the collector 150 and/or debris mitigation arrangement 200. The mirrors or other optical elements may additionally and/or alternatively be used in the conditioning of the beam 108, for example focusing the beam 108 and/or ensuring that the beam has a certain numerical aperture or parallel relationship with elements (e.g., foils or mirrors) or the like of the collector 150 or debris mitigation arrangement 200.

Figure 13:
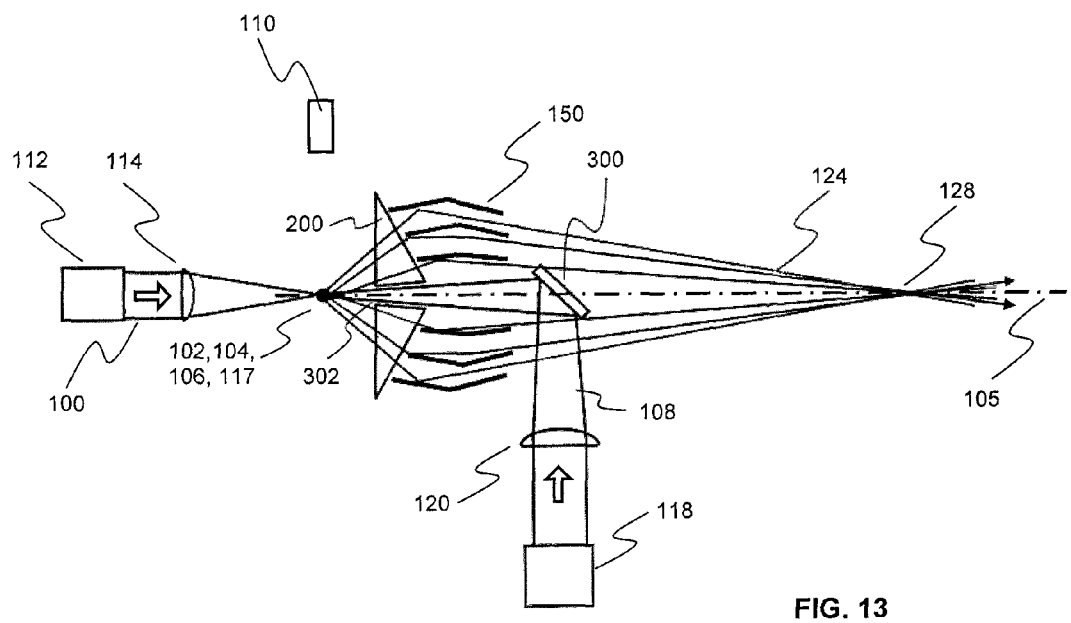
FIG. 13 schematically depicts a radiation source with a debris mitigation arrangement, according to another embodiment of the present invention.

FIG. 13 depicts an embodiment which may be interpreted as a modification of that shown in FIG. 12. In FIG. 13, the first beam of laser radiation 100 is, as described above, directed along the optical axis 105 toward the plasma formation location 104, to form a disc-shaped modified fuel target 106 having a direction of elongation (e.g., a radius perpendicular to the optical axis 105). The second beam of radiation 108 is directed to pass through both the grazing incidence collector 150 (after being deflected by a mirror, or other re-directing element 300) and the debris mitigation arrangement 200, along the optical axis 105, before being incident on the modified fuel target 106. This configuration (or variations thereon) may allow for the design of the source as a whole to be more compact, and/or to facilitate the directing of the second beam of radiation 108 towards a side of the modified fuel target 106 that faces toward the collector 150. When the debris mitigation arrangement 200 comprises or is a solid object (e.g., a stationary or rotatable foil trap), the configuration may be facilitated by the provision of a hollow axis 302 in and extending through the debris mitigation arrangement 200, through and along which axis the second beam of radiation 108 is directed.

In the embodiment shown, the second beam of laser radiation 108 is directed in an opposite direction to that of the first beam of radiation 100. This may allow more design freedom in the arrangement as a whole, and/or allow for one or more of the advantages described above or below to be realized (e.g., the angle of incidence of the first and/or second beam of radiation 100, 108 relative to the fuel target).

In other embodiments (not shown) one or both of the first and/or second beams may pass through the collector, and/or the debris mitigation arrangement.

The debris mitigation arrangement is not limited to the arrangement shown in FIGS. 12 and 13, but can also be applied to other arrangements, such as that shown in and described with reference to FIG. 8. In any example, the debris mitigation arrangement may be any suitable arrangement, for example one or more, or a combination of: a static foil trap, a rotating foil trap, a gas flow based system, or an electric and/or magnetic field (static or fluctuating) based arrangement.

In general, it may be particularly advantageous to direct the first beam of laser radiation towards the fuel stream substantially along an optical axis of the radiation source, and the collector thereof. As described above, this ensures that the subsequently generated modified fuel target is elongate in a direction substantially perpendicular to the optical axis. This may be advantageous, since when a second beam of radiation 108 is incident on the modified fuel target (in general, regardless of the angle of incidence), the shape and orientation of the target will ensure that the radiation generating plasma generates EUV radiation in a direction substantially perpendicular to the direction of elongation of the target—i.e., in a direction along the optical axis, which direction the collector is of course designed to work with, thus improving radiation collection. This is particularly true when the collector is a grazing incidence collector, since grazing incidence collectors are not usually used in the configurations as outlined above (as already discussed), and thus such principles have not been considered in relation to such grazing incidence collectors.

Thus, according to another embodiment of the present invention, there is provided a radiation source (or a lithographic apparatus comprising of being in connection with such a radiation source). The radiation source comprises: a fuel stream generator configured to generate a fuel stream and to direct the fuel stream along a trajectory towards a plasma formation location; a pre-pulse laser radiation assembly configured to direct a first beam of laser radiation at the fuel stream at the plasma formation location to generate a modified fuel target; a main pulse laser radiation assembly configured to direct a second beam of laser radiation at the modified fuel target at the plasma formation location to generate a radiation generating plasma; and a grazing incidence collector configured to collect radiation generated by the radiation generating plasma and to direct collected radiation along an optical axis of the radiation source; the first beam of laser radiation being directed toward the fuel stream substantially along the optical axis.

The radiation source may have, where appropriate, any one or more features described above (including combinations thereof), which features have been discussed in detail, including advantages thereof. For example, the second beam of laser radiation may be directed in an opposite direction to that of the first beam of radiation. As discussed elsewhere, this may allow more design freedom in the arrangement as a whole (which might result in a more compact overall design, and/or a more accessible design for maintenance reasons or the like), and/or allow for one or more of the advantages described above or below to be realized (e.g., the angle of incidence of the first and/or second beam of radiation 100, 108 relative to the fuel target).

In the above embodiments, it has been described how the first beam of radiation (which may be referred to as the pre-pulse beam of radiation) may have a propagation direction substantially along the optical axis (which may be in either direction along that axis, depending on the implementation of the invention). "Substantially" in this context may comprise a propagation direction with an angle of inclination less than 20°, less than 10°, less than 5°, less than 3°, less than 1°, less than 0.5° with respect to the optical axis or parallel to that axis. Similarly, the first beam of radiation has been described as being used to form a disk-like shaped modified fuel target, or more generally a flattened shape target. The modified target may thus have a more elongate shape in a direction substantially perpendicular to the optical axis as a result of the flattening. Corresponding to the description of the first beam of radiation being "substantially" along the optical axis, the direction of elongation of the modified target may be less than less than 20°, less than 10°, less than 5°, less than 3°, less than 1° off the perpendicular to the optical axis, or perpendicular to that optical axis.

In any embodiment, the optical axis of the radiation source that is referred to (e.g., along, or relative to, a radiation beam may be directed) may be an optical axis of the collector of the radiation source. This is because the directing of the radiation beam (e.g., laser radiation beam or beams) has an impact on radiation collected by that collector, making the direction of radiation relative to the optical axis of the collector an important consideration.

In embodiments, a radiation beam has been described as being potentially at least partially reflected, or reflectable, off a modified target. The reflection may be directed toward a particular location, such as a beam dump, or window, or aperture, or any location or element which substantially prevents the radiation being scattered or otherwise re-directed into and/or through the lithographic apparatus (especially along a main beam path thereof).

The radiation source of an embodiment of the invention may be appropriately used in a lithographic apparatus, for example the apparatus shown in FIG. 1 or FIG. 2 (with the radiation source of this invention replacing that described in relation to FIG. 2). Of course, the radiation source may also be used in other environments, not necessarily associated with lithography or lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools.

Further, the substrate may be processed more than once, for example in order to create a multilayer IC, so that the term substrate used herein may also refer to a substrate that already contains multiple processed layers.

The term "trajectory" is used herein to describe a path of a fuel stream, and is to be understood as the free path of the fuel stream through space (i.e., free space). For example, this may describe the path of the stream when the stream has left a nozzle or outlet of a fuel reservoir (or other supporting structure).

The fuel stream may be continuous, but is more likely to be at least partly discontinuous, for example comprising a plurality of droplets. Droplets may be easier to target, or, in general, easier to use in the generation of a radiation generating plasma.

When describing the lithographic apparatus, the term "lens," where the context allow, may refer to any one or combination of various types of optical components, including refractive, reflective, magnetic, electromagnetic and electrostatic optical components.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building storing blocks illustrating the implementation of specified functions and relationships thereof. The boundaries of these functional building storing blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

According to a further embodiment there may be provided a radiation source including a fuel stream generator configured to generate a fuel stream and to direct the fuel stream along a trajectory towards a plasma formation location, a laser radiation assembly configured to direct laser radiation in a first direction at the fuel stream at the plasma formation location to generate, in use, a radiation generating plasma, and a grazing incidence collector, constructed and arranged to collect radiation generated by the radiation generating plasma that has a propagation direction with a component opposite to the first direction.

In an embodiment, the grazing incidence collector may be located in-between the plasma formation location and an intermediate focus, or at any other focal point of the grazing incidence collector.

In an embodiment, the first direction may be substantially along an optical axis of the radiation source, but in an opposite direction to a general propagation direction of radiation generated by the radiation generating plasma and collected by the grazing incidence collector.

In an embodiment, the grazing incidence collector may at least partially surround a beam path of the laser radiation, such that the laser radiation passes through the grazing incidence collector before being incident on fuel.

In an embodiment, the first direction may extend (or be) through the grazing incidence collector.

In an embodiment, the first direction may extend (or be) through the grazing incidence collector, and along a longitudinal axis of symmetry of the grazing incidence collector.

In an embodiment, on an opposite side of the plasma formation location to the grazing incidence collector (e.g., downstream of the first direction), there may be provided one or more of: an aperture; a window; a laser beam dump; a debris mitigation arrangement; and/or a debris trap.

In an embodiment, the laser radiation assembly may be arranged to initially direct laser radiation in a second direction, the laser radiation further comprising a re-directing configuration arranged to receive the laser radiation propagating in the second direction, and to re-direct the laser radiation along the first direction.

In an embodiment, a gas flow generator may be provided for generating a gas flow and/or for directing the gas flow toward or across the re-directing configuration.

In an embodiment, the laser radiation assembly may comprise a laser for generating the laser radiation.

In an embodiment, the laser radiation assembly may comprise focusing optics for focusing the laser radiation on to the fuel stream at the plasma formation location, and/or the re-directing configuration may form a part of focusing optics for focusing the laser radiation on to the fuel stream at the plasma formation location.

In an embodiment, the re-directing configuration may comprise one or more of: a lens; a mirror; and/or a prism.

In an embodiment, the grazing incidence collector may comprise a collector shell. The grazing incidence collector may comprise one or more nested shells. The nested shells may be concentrically arranged.

Further embodiments may be provided by the following numbered clauses:

1. A radiation source comprising:
a fuel stream generator configured to generate a fuel stream and to direct the fuel stream along a trajectory towards a plasma formation location;
a pre-pulse laser radiation assembly configured to direct a first beam of laser radiation at the fuel stream at the plasma formation location to generate a modified fuel target;
a main pulse laser radiation configured to direct a second beam of laser radiation at the modified fuel target at the plasma formation location to generate a radiation generating plasma; and
a collector configured to collect radiation generated by the radiation generating plasma and to direct collected radiation along an optical axis of the radiation source;
the first beam of laser radiation being directed toward the fuel stream substantially along the optical axis; and
the second beam of laser radiation being directed toward the modified fuel target substantially at an angle of greater than 0 degrees and less than 90 degrees with respect to the optical axis.

2. The radiation source of claim 1, wherein the second beam of radiation is directed toward a side of the modified fuel target that faces away from the collector.
3. The radiation source of claim 1, wherein the second beam of radiation is directed toward a side of the modified fuel target that faces the collector.
4. The radiation source of clause 1, wherein the second beam of radiation is directed toward the collector, and wherein the collector is provided with an aperture through which the second beam of radiation may pass, should the second beam of radiation not be incident on the fuel stream or the modified fuel target.
5. The radiation source of clause 1, wherein the collector is a normal incidence collector, and the first beam of radiation is directed through an aperture provided in the normal incidence collector, along the optical axis of the radiation source, in the general propagation direction of radiation generated by the by the radiation generating plasma and collected by the normal incidence collector.
6. The radiation source of clause 1, wherein the collector is a normal incidence collector, and the first beam of radiation is directed toward the collector, along the optical axis of the radiation source, but in an opposite direction to a general propagation direction of radiation generated by the radiation generating plasma and collected by the normal incidence collector.
7. The radiation source of clause 1, wherein the collector is a grazing incidence collector located in-between the plasma formation location and an intermediate focus, or other focal point, of the grazing incidence collector, and the first beam of radiation is directed through the grazing incidence collector, along the optical axis of the radiation source, but in an opposite direction to a general propagation direction of radiation generated by the radiation generating plasma and collected by the grazing incidence collector.
8. The radiation source of clause 1, wherein the collector is a grazing incidence collector located in-between the plasma formation location and an intermediate focus, or other focal point, of the grazing incidence collector, and the first beam of radiation is directed toward the grazing incidence collector, along the optical axis of the radiation source, in a general propagation direction of radiation generated by the radiation generating plasma and collected by the grazing incidence collector.
9. The radiation source of clause 1, wherein the fuel stream generator comprises: a reservoir configured to retain a volume of fuel; and a nozzle, in fluid connection with the reservoir, and configured to direct the fuel stream along the trajectory towards the plasma formation location.
10. The radiation source of clause 1, wherein the stream of fuel comprises a stream of droplets of fuel.
11. The radiation source of clause 1, wherein the first beam of laser radiation is configured to ensure that the modified fuel target is a substantially disc shaped cloud, the disc having a radius that is substantially perpendicular with respect to the optical axis
12. The radiation source of clause 1, wherein a debris mitigation arrangement is located in-between the plasma formation location and the collector.
13. A radiation source comprising:
a fuel stream generator configured to generate a fuel stream and to direct the fuel stream along a trajectory towards a plasma formation location;
a pre-pulse laser radiation assembly configured to direct a first beam of laser radiation at the fuel stream at the plasma formation location to generate a modified fuel target;
a main pulse laser radiation assembly configured to direct a second beam of laser radiation at the modified fuel target at the plasma formation location to generate a radiation generating plasma; and
a collector configured to collect radiation generated by the radiation generating plasma and to direct collected radiation along an optical axis of the radiation source;
wherein the first beam of laser radiation is directed toward the fuel stream substantially along the optical axis, and
wherein the second beam of laser radiation is directed toward the modified fuel target substantially at an angle of greater than 0 degrees and less than 90 degrees with respect to the optical axis.
14. The radiation source of clause 13, wherein the second beam of radiation is directed toward a side of the modified fuel target that faces away from the collector.
15. The radiation source of clause 13, wherein the second beam of radiation is directed toward a side of the modified fuel target that faces the collector.
16. The radiation source of clause 13, wherein the second beam of radiation is directed toward the collector, and wherein the collector is provided with an aperture through which the second beam of radiation may pass, should the second beam of radiation not be incident on the fuel stream or the modified fuel target.
17. The radiation source of clause 13, wherein the collector is a normal incidence collector, and the first beam of radiation is directed through an aperture provided in the normal incidence collector, along the optical axis of the radiation source, in the general propagation direction of radiation generated by the by the radiation generating plasma and collected by the normal incidence collector.
18. The radiation source of clause 13, wherein the collector is a normal incidence collector, and the first beam of radiation is directed toward the collector, along the optical axis of the radiation source, but in an opposite direction to a general propagation direction of radiation generated by the radiation generating plasma and collected by the normal incidence collector.
19. The radiation source of clause 13, wherein the collector is a grazing incidence collector located in-between the plasma formation location and an intermediate focus, or other focal point, of the grazing incidence collector, and the first beam of radiation is directed through the grazing incidence collector, along the optical axis of the radiation source, but in an opposite direction to a general propagation direction of radiation generated by the radiation generating plasma and collected by the grazing incidence collector.
20. The radiation source of clause 13, wherein the collector is a grazing incidence collector located in-between the plasma formation location and an intermediate focus, or other focal point, of the grazing incidence collector, and the first beam of radiation is directed toward the grazing incidence collector, along the optical axis of the radiation source, in a general propagation direction of radiation generated by the radiation generating plasma and collected by the grazing incidence collector.
21. The radiation source of clause 13, wherein a debris mitigation arrangement is located in-between the plasma formation location and the collector.
22. The radiation source of clause 13, wherein the fuel stream generator comprises:

a reservoir configured to retain a volume of fuel; and
a nozzle, in fluid connection with the reservoir, configured to direct the fuel stream along the trajectory towards the plasma formation location.

23. The radiation source of clause 13, wherein the stream of fuel comprises a stream of droplets of fuel.

24. The radiation source of clause 23, wherein the first beam of laser radiation is configured to ensure that the modified fuel target is a substantially disc shaped cloud, the disc having a radius that is substantially perpendicular with respect to the optical axis.

25. A lithographic apparatus comprising:
a radiation source having:
a fuel stream generator configured to generate a fuel stream and to direct the fuel stream along a trajectory towards a plasma formation location;
a pre-pulse laser radiation assembly configured to direct a first beam of laser radiation at the fuel stream at the plasma formation location to generate a modified fuel target;
a main pulse laser radiation assembly configured to direct a second beam of laser radiation at the modified fuel target at the plasma formation location to generate a radiation generating plasma; and
a collector configured to collect radiation generated by the radiation generating plasma and to direct collected radiation along an optical axis of the radiation source;
wherein the first beam of laser radiation is directed toward the fuel stream substantially along the optical axis, and the second beam of laser radiation is directed toward the modified fuel target substantially at an angle of greater than 0 degrees and less than 90 degrees with respect to the optical axis.

26. The radiation source of clause 25, wherein a debris mitigation arrangement is located in-between the plasma formation location and the collector.

27. A radiation source comprising:
a fuel stream generator configured to generate a fuel stream and to direct the fuel stream along a trajectory towards a plasma formation location;
a pre-pulse laser radiation assembly configured to direct a first beam of laser radiation at the fuel stream at the plasma formation location to generate a modified fuel target;
a main pulse laser radiation assembly configured to direct a second beam of laser radiation at the modified fuel target at the plasma formation location to generate a radiation generating plasma; and
a grazing incidence collector configured to collect radiation generated by the radiation generating plasma and to direct collected radiation along an optical axis of the radiation source;
the first beam of laser radiation being directed toward the fuel stream substantially along the optical axis.

28. The radiation source of clause 27, wherein a debris mitigation arrangement is located in-between the plasma formation location and the grazing incidence collector.

29. The radiation source of clause 28, wherein the debris mitigation arrangement is a stationary or rotatable foil trap, and wherein the first beam of laser radiation, and/or the second beam of laser radiation, is directed along and through a hollow axis of the foil trap.

30. The radiation source of clause 27, wherein the second beam of laser radiation is directed toward the modified fuel target substantially along the optical axis, and in the same direction to that of the first beam of radiation.

31. The radiation source of clause 27, wherein the second beam of laser radiation is directed toward the modified fuel target substantially along the optical axis, and in an opposite direction to that of the first beam of radiation.

32. The radiation source of clause 27, wherein the second beam of laser radiation is directed toward the modified fuel target substantially at an angle of greater than 0 degrees and less than 90 degrees with respect to the optical axis.

33. The radiation source clause 27, wherein the first and/or second beam of radiation is directed through the grazing incidence collector, along the optical axis of the radiation source, but in an opposite direction to a general propagation direction of radiation generated by the radiation generating plasma and collected by the grazing incidence collector.

34. The radiation source of clause 27, wherein the first and/or second beam of radiation is directed toward the grazing incidence collector, along the optical axis of the radiation source, in a general propagation direction of radiation generated by the radiation generating plasma and collected by the grazing incidence collector.

35. The radiation source of clause 27, wherein the first and/or second beam of radiation is directed toward a side of the fuel stream or modified fuel target that faces away from the grazing incidence collector.

36. The radiation source of clause 27, wherein the first and/or second beam of radiation is directed toward a side of the fuel stream or modified fuel target that faces the grazing incidence collector.

37. The radiation source of clause 27, wherein the first and/or second beam of radiation is directed toward the grazing incidence collector, and wherein the grazing incidence collector is provided with an aperture through which the first and/or second beam of radiation may pass, should the first and/or second beam of radiation not be incident on the fuel stream or the modified fuel target.

38. The radiation source of clause 27, wherein the grazing incidence collector is located in-between the plasma formation location and an intermediate focus, or other focal point, of the grazing incidence collector.

39. The radiation source of clause 27, wherein the fuel stream generator comprises: a reservoir configured to retain a volume of fuel; and a nozzle, in fluid connection with the reservoir, and configured to direct the fuel stream along the trajectory towards the plasma formation location.

40. The radiation source of clause 27, wherein the stream of fuel comprises a stream of droplets of fuel.

41. The radiation source of clause 27, wherein the first beam of laser radiation is configured to ensure that the modified fuel target is a substantially disc shaped cloud, the disc having a radius that is substantially perpendicular with respect to the optical axis.

The breadth and scope of the present invention should not be limited by any of the above-described exemplary embodiments, but should be defined only in accordance with the following claims and their equivalents.

The invention claimed is:
1. A radiation source comprising:
a fuel stream generator configured to:
generate a fuel stream, and
direct the fuel stream along a trajectory towards a plasma formation location;
a pre-pulse laser radiation assembly configured to:
direct a first beam of laser radiation at the fuel stream at the plasma formation location substantially along an optical axis of the radiation source, and generate a modified fuel target comprising a desired shape and orientation;
a main pulse laser radiation assembly configured to:
direct a second beam of laser radiation at the modified fuel target at the plasma formation location substantially at an angle greater than 0 degrees and less than 90 degrees with respect to the optical axis, and
generate a radiation generating plasma,
wherein the desired shape and orientation of the modified fuel target ensures reflection of a portion of the second beam of laser radiation, unused by the modified fuel target in generation of the radiation generating plasma, from the modified fuel target; and
a grazing incidence collector configured to:
collect radiation generated by the radiation generating plasma; and
direct the collected radiation along the optical axis.

2. The radiation source of claim 1, wherein the main pulse laser radiation assembly is configured to direct the second beam of laser radiation towards a side of the modified fuel target facing away from the grazing incidence collector.

3. The radiation source of claim 1, wherein the main pulse laser radiation assembly is configured to direct the second beam of laser radiation towards a side of the modified fuel target facing the grazing incidence collector.

4. The radiation source of claim 1, wherein:
the main pulse laser radiation assembly is configured to direct the second beam of laser radiation in a direction towards the grazing incidence collector; and
the grazing incidence collector comprises an aperture configured to allow passage to at least a portion of the second beam of laser radiation that is not incident on the fuel stream or the modified fuel target.

5. The radiation source of any of claim 1, wherein the pre-pulse laser radiation assembly is configured to direct the first beam of laser radiation, along the optical axis of the radiation source, in a propagation direction of the radiation generated by the radiation generating plasma.

6. The radiation source of claim 1, wherein the pre-pulse laser radiation assembly is configured to direct the first beam of laser radiation towards the grazing incidence collector, along the optical axis of the radiation source, in an opposite direction to a propagation direction of the radiation generated by the radiation generating plasma.

7. The radiation source of any of claim 1, wherein:
the grazing incidence collector is located between the plasma formation location and a focal point of the grazing incidence collector; and
the pre-pulse laser radiation assembly is configured to direct the first beam of laser radiation through the grazing incidence collector, along the optical axis of the radiation source, in an opposite direction to a propagation direction of the radiation generated by the radiation generating plasma and collected by the grazing incidence collector.

8. The radiation source of any of claim 1, wherein:
the grazing incidence collector is located between the plasma formation location and a focal point of the grazing incidence collector; and
the pre-pulse laser radiation assembly is configured to direct the first beam of laser radiation towards the grazing incidence collector, along the optical axis of the radiation source, in a propagation direction of the radiation generated by the radiation generating plasma and collected by the grazing incidence collector.

9. The radiation source of claim 1, wherein:
the pre-pulse laser radiation assembly is configured to ensure that the modified fuel target comprises a substantially disc shaped cloud after being hit by the first beam of laser radiation; and
the disc shaped cloud comprises a radius substantially perpendicular with respect to the optical axis.

10. A lithographic apparatus comprising, or in connection with, a radiation source, the radiation source comprising:
a fuel stream generator configured to:
generate a fuel stream, and
direct the fuel stream along a trajectory towards a plasma formation location;
a pre-pulse laser radiation assembly configured to:
direct a first beam of laser radiation at the fuel stream at the plasma formation location substantially along an optical axis of the radiation source, and
generate a modified fuel target comprising a desired shape and orientation;
a main pulse laser radiation assembly configured to:
direct a second beam of laser radiation at the modified fuel target at the plasma formation location substantially at an angle greater than 0 degrees and less than 90 degrees with respect to the optical axis, and
generate a radiation generating plasma,
wherein the desired shape and orientation of the modified fuel target ensures reflection of a portion of the second beam of laser radiation, unused by the modified fuel target in generation of the radiation generating plasma, from the modified fuel target; and
a grazing incidence collector configured to:
collect radiation generated by the radiation generating plasma; and
direct the collected radiation along the optical axis.

11. A radiation source comprising:
a fuel stream generator configured to:
generate a fuel stream, and
direct the fuel stream along a trajectory towards a plasma formation location;
a pre-pulse laser radiation assembly configured to:
direct a first beam of laser radiation at the fuel stream at the plasma formation location substantially along an optical axis of the radiation source, and
generate a modified fuel target comprising a desired shape and orientation;
a main pulse laser radiation assembly configured to:
direct a second beam of laser radiation at the modified fuel target at the plasma formation location, and
generate a radiation generating plasma,
wherein the desired shape and orientation of the modified fuel target ensures reflection of a portion of the second beam of laser radiation, unused by the modified fuel target in generation of the radiation generating plasma, from the modified fuel target; and
a grazing incidence collector, located downstream of the radiation generating plasma, configured to:
collect radiation generated by the radiation generating plasma; and
direct the collected radiation along the optical axis of the radiation source.

12. The radiation source of claim 11, further comprising a debris mitigation arrangement, located between the plasma formation location and the grazing incidence collector, comprising a stationary or rotatable foil trap; and
wherein the pre-pulse laser radiation assembly or the main pulse laser radiation assembly is configured to direct the first or second beam of laser radiation, respectively, along and through a hollow axis of the debris mitigation arrangement.

13. The radiation source of claim 11, wherein the main pulse laser radiation assembly is configured to direct the second beam of laser radiation towards the modified fuel target substantially along the optical axis, and in the same direction to that of the first beam of radiation.

14. The radiation source of claim 11, wherein the main pulse laser radiation assembly is configured to direct the second beam of laser radiation towards the modified fuel target substantially along the optical axis, and in an opposite direction to that of the first beam of radiation.

15. The radiation source of claim 11, wherein the main pulse laser radiation assembly is configured to direct the second beam of laser radiation towards the modified fuel target substantially at an angle greater than 0 degrees and less than 90 degrees with respect to the optical axis.

16. The radiation source of claim 11, wherein the pre-pulse laser radiation assembly or the main pulse laser radiation assembly is configured to direct the first or second beam of laser radiation, respectively, through the grazing incidence collector, along the optical axis of the radiation source, in an opposite direction to a propagation direction of the radiation generated by the radiation generating plasma and collected by the grazing incidence collector.

17. The radiation source of claim 11, wherein the pre-pulse laser radiation assembly or the main pulse laser radiation assembly is configured to direct the first or second beam of laser radiation, respectively, towards the grazing incidence collector, along the optical axis of the radiation source, in a propagation direction of the radiation generated by the radiation generating plasma and collected by the grazing incidence collector.

18. The radiation source of claim 11, wherein the pre-pulse laser radiation assembly or the main pulse laser radiation assembly is configured to direct the first or second beam of laser radiation, respectively, toward a side of the fuel stream or a side of the modified fuel target facing away from the grazing incidence collector.

19. The radiation source of claim 11, wherein the pre-pulse laser radiation assembly or the main pulse laser radiation assembly is configured to direct the first or second beam of laser radiation, respectively, towards a side of the fuel stream or a side of the modified fuel target facing the grazing incidence collector.

20. The radiation source of claim 11, wherein:
the pre-pulse laser radiation assembly or the main pulse laser radiation assembly is configured to direct the first or second beam of laser radiation, respectively, toward the grazing incidence collector; and
the grazing incidence collector comprises an aperture configured to allow passage to at least a portion of the first or second beam of laser radiation that is not incident on the fuel stream or the modified fuel target.

21. The radiation source of 11, wherein the grazing incidence collector is located between the plasma formation location and a focal point of the grazing incidence collector.

22. The radiation source of claim 11, wherein:
the pre-pulse laser radiation assembly is configured to ensure that the modified fuel target comprises a substantially disc shaped cloud after being hit by the first beam of laser radiation; and
the disc shaped cloud comprises a radius substantially perpendicular with respect to the optical axis.

23. A lithographic apparatus comprising:
a radiation source comprising:
a fuel stream generator configured to:
generate a fuel stream, and
direct the fuel stream along a trajectory towards a plasma formation location,
a pre-pulse laser radiation assembly configured to:
direct a first beam of laser radiation at the fuel stream at the plasma formation location substantially along an optical axis of the radiation source, and
generate a modified fuel target comprising a desired shape and orientation,
a main pulse laser radiation assembly configured to:
direct a second beam of laser radiation at the modified fuel target at the plasma formation location substantially at an angle of greater than 0 degrees and less than 90 degrees with respect to the optical axis, and
generate a radiation generating plasma,
wherein the desired shape and orientation of the modified fuel target ensures reflection of a portion of the second beam of laser radiation, unused by the modified fuel target in generation of the radiation generating plasma, from the modified fuel target, and
a grazing incidence collector configured to:
collect radiation generated by the radiation generating plasma, and
direct the collected radiation into a radiation beam along the optical axis;
an illumination system configured to condition the radiation beam;
a support structure configured to support a patterning device, the patterning device being capable of imparting the radiation beam with a pattern in its cross-section to form a patterned radiation beam; and
a projection system configured to project the patterned radiation beam onto a substrate.

\* \* \* \* \*